United States Patent [19]

Kawahara et al.

[11] Patent Number: 4,696,021
[45] Date of Patent: Sep. 22, 1987

[54] SOLID-STATE AREA IMAGING DEVICE HAVING INTERLINE TRANSFER CCD MEANS

[75] Inventors: Atsushi Kawahara; Norihiko Takatsu, both of Kawasaki, Japan

[73] Assignee: Nippon Kogaku K.K., Tokyo, Japan

[21] Appl. No.: 884,865

[22] Filed: Jul. 16, 1986

Related U.S. Application Data

[63] Continuation of Ser. No. 499231, May 31, 1983, abandoned.

[30] Foreign Application Priority Data

Jun. 3, 1982 [JP] Japan ................... 57-93987
Aug. 31, 1982 [JP] Japan ................. 57-150122

[51] Int. Cl.⁴ .................. G11C 19/28; H01L 29/78; H01L 27/14; H01L 31/00
[52] U.S. Cl. ........................ 377/58; 357/24; 357/30
[58] Field of Search ............... 357/24, 30; 377/57-63

[56] References Cited

U.S. PATENT DOCUMENTS 3,845,295 10/1974 Williams et al. ............. 357/24 LR
4,028,716  6/1977 Van Santen et al. .......... 357/24 LR
4,040,076  8/1977 Kosonocky et al. .......... 357/24 LR
4,194,213  3/1980 Kano et al. ................. 357/24 LR

OTHER PUBLICATIONS

Herrman "High Speed CCD Line Imager" RCA Techanical Note No. 1154 (6/76).

Primary Examiner—Gene M. Munson
Attorney, Agent, or Firm—Michael N. Meller

[57] ABSTRACT

A solid-state area imaging device for generating an output indicative of an intensity distribution of light received at a predetermined plane is so constructed that the undesired charges of light-receiver photodiodes and the undesired charges of a vertical transfer section are drained collectively. This construction realizes a solid-state area imaging device having a high picture element density and capable of ensuring a high resolution and more particularly a high-efficiency solid-state area imaging device having interline transfer CCD means and well suited for use with electronic shutter equipped electronic still picture cameras or variable shutter speed video cameras.

2 Claims, 26 Drawing Figures

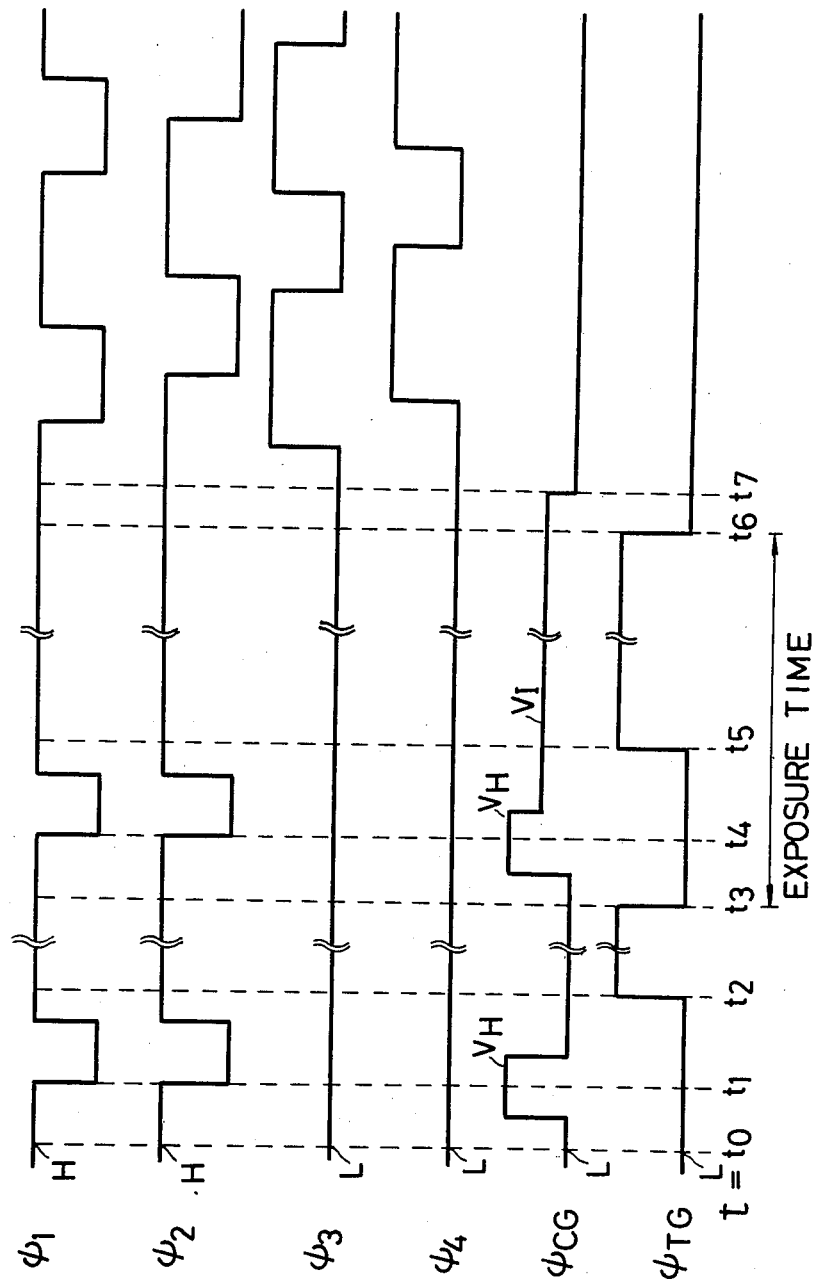

SOLID-STATE AREA IMAGING DEVICE HAVING INTERLINE TRANSFER CCD MEANS

This application is a continuation of application Ser. No. 499,231, field May 31, 1983, now abandoned.

BACKGROUND OF THE INVENTION

1. Field of the Invention

The present invention relates to a solid-state area imaging device having an interline transfer CCD means which is well suited for use with electronic still picture cameras and variable shutter speed video cameras.

2. Description of the Prior Art

In the past, it has been known to use a solid-state area imaging device having interline transfer CCDs in cases where it is desired to use a solid-state area imaging device having an electronic shutter function with an electronic still picture camera, i.e., a still picture photographing and recording camera including electronic imaging means and electric or magnetic recording means capable of recording or reproducing an electric signal produced by the imaging device, variable shutter speed video camera or the like.

SUMMARY OF THE INVENTION

It is the primary object of the invention to provide a solid-state area imaging device having interline transfer CCD means which is high in picture element density and capable of ensuring a high resolution and which is particularly well suited for use with an electronic still picture camera having an electronic shutter function, a variable shutter speed video camera or the like and capable of draining the undesired charges of the light-receiving photodiodes and the undesired charges of the vertical transfer section collectively.

BRIEF DESCRIPTION OF THE DRAWINGS

FIG. 3. is a timing chart showing an example of the method of driving the device of FIGS. 2A and 2B.

DESCRIPTION OF THE PREFERRED EMBODIMENTS

Figure 1A:
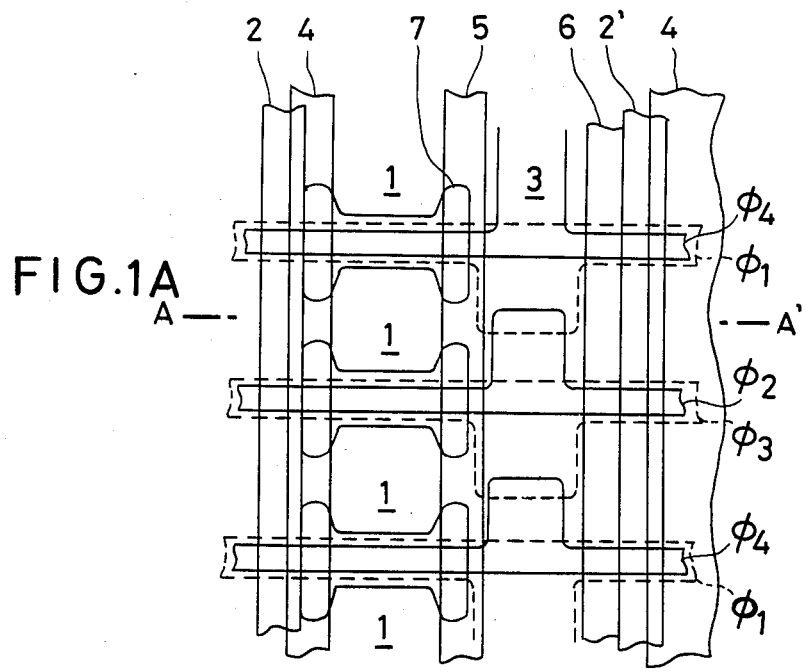
FIGS. 1A, 1B and 1C are respectively a plan view, A-A' sectional view and schematic potential barrier diagram showing schematically the principal parts of an example of the prior art interline transfer CCD.
Figure 1B:
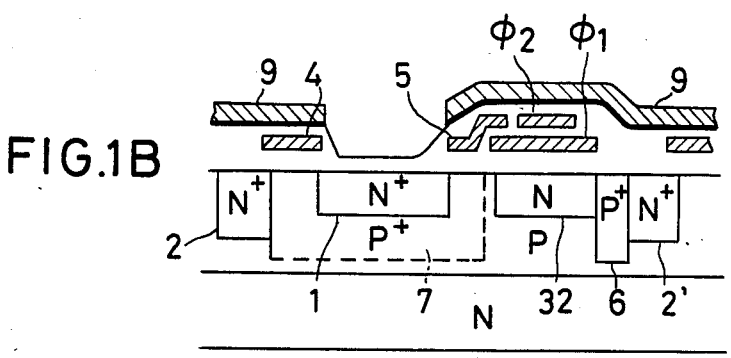
Figure 1C:
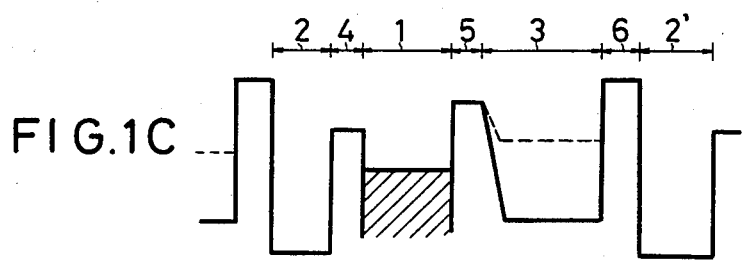

Referring first to FIGS. 1A and 1B, there is illustrated an example of the conventional four-phase interline transfer CCD. FIG. 1A is a plan-view and FIG. 1B is a sectional view of the portion taken along the line A-A' of FIG. 1A. More specifically, an overflow drain 2 forming excess charge draining means is arranged parallely on one side of an array of photodiodes 1 forming a light-sensing section and a vertical transfer section 3, including a signal charge vertical transfer CCD, is similarly arranged on the other side of the photodiode array 1. An overflow control gate 4 for overflow potential controlling purposes is also arranged between the photodiode array 1 and the overflow drain 2, and also disposed between the photodiode array 1 and the vertical transfer section 3 is a transfer gate 5 for transferring the signal charges stored in the photodiode array 1 to a buried channel 32 below electrodes $\Phi_1$, $\Phi_2$, $\Phi_3$ and $\Phi_4$ of the vertical transfer section 3. Considering this as a unit element array of the vertical photodetecting and transfer channel of the interline transfer CCD, channel stops 6 and 7 for preventing the spreading of charges in the horizontal direction are arranged between the units. By arranging a plurality of unit element arrays, a two-dimensional image sensor is assembled. Note that in the vertical transfer section 3 including the vertical transfer electrodes $\Phi_1$, $\Phi_2$, $\Phi_3$ and $\Phi_4$ and the buried channel 32, during the vertical transfer the potentials under the channels 32 vary vertically between the solid-line position and the broken-line position as shown in the potential diagram of FIG. 1C illustrated below and aligned in position with FIG. 1B.

To provide the conventional interline transfer CCD of this construction with an electronic shutter function, it is necessary to provide an operational function such that after the charges stored in the light-receiver photodiode array have been drained as a whole, the exposure is effected for the required time and upon completion of the exposure the signal charges produced at the photodiodes by the exposure are transferred by some means to below the vertical transfer electrodes from which the undesired charges have already been removed. Thus, the conventional driving system is designed so that the collective draining of the undesired charges from the photodiode array 1 prior to each exposure is effected by applying a high voltage to the overflow control gate 4 and thereby decreasing the potential barriers between the photodiodes and the overflow drain and the undesired charges under the electrodes $\Phi_1$, $\Phi_2$, $\Phi_3$ and $\Phi_4$ are successively drained to the outside of the transfer CCD through the same path as the signal charges by virtue of the vertical transfer and horizontal transfer effected prior to the transfer following the completion of the exposure, thereby providing the desired shutter function.

However, the above-described electronic shutter function of the conventional interline transfer CCD has some disadvantages which will be described hereunder.

The first disadvantage is that the undesired charges under the vertical transfer electrodes, e.g., the charges due to dark currents, are drained via the same path as the signal charges and thus a considerable time is required for draining the undesired charges no matter how fast the transfers are effected.

For instance, considering the case where the exposure control is effected by the TTL direct light metering system, if the undesired charges produced at the vertical transfer section 3 by the dark currents or the like are drained after the completion of the light metering, particularly in the case of a high speed shutter (where the exposure time is very short), the time required for draining the undesired charges is added to the exposure time and there is thus the danger of making the exposure excessive correspondingly. While it is conceivable to complete the draining of the undesired charges from the vertical transfer section 3 before the completion of the light measurement, it is impossible for the TTL direct light metering system to know the shutter speed preliminarily, with the result that the draining of the undesired charges must be effected before the beginning of each exposure or upon the initiation of each exposure and this makes it necessary to apply transfer clocks over a long period of time in the case of a low speed shutter (where the exposure time is very long), thereby giving rise to a disadvantage of increasing the power consumption.

The second disadvantage is due to the draining of the undesired charges from the photodiodes to the overflow drain by means of the overflow control gate in place of the transfer gate. In other words, after the undesired charges have been drained to the overflow drain prior to each exposure, the exposure is effected for the time corresponding to the shutter speed and then the signal charges stored at the photodiodes are transferred to the vertical transfer CCD by means of a transfer gate. In this case, irregularity, nonuniformity and the like occur in the geometrical dimensions, impurity densities, etc., within the elements due to the manufacturing process, etc., and thus the potential barrier under the overflow control gate and the potential barrier under the transfer gate differ in level from each other in the horizontal direction with respect to each photodiode. Moreover, the two potential barriers also vary in the vertical direction independently of each other. Therefore, when the charges are transferred from the photodiodes to the vertical transfer CCD after the completion of the exposure, there is a disadvantage that the signal charges are transferred incompletely or the excess charges are transferred with the resulting superposition of noise and the S/N of the signal charges is deteriorated greatly. This in turn results in a deteriorated picture quality, thus giving rise to a disadvantage that there must be a high degree of uniformity among the elements in order to realize the desired function of draining the undesired charges to the overflow drain.

The third disadvantage is due to the transfer of the signal charges from the photodiodes to the vertical transfer CCD by means of the transfer gate. In other words, it has been the usual practice that after applying a low voltage to the transfer gate, thereby making the level of the potential barriers under the transfer gate higher than the level of the potential barriers under the overflow control gate, and then exposing and storing the charges in this condition, a high voltage pulse is momentarily applied to the transfer gate so that the potential barriers under the transfer gate are lowered and the signal charges are transferred to the vertical transfer CCD from the photodiodes.

However, there is a disadvantage that the signal charges at the photodiodes cannot be transferred completely in such a short period of time and some a part of the signal charges is inevitably left at the photodiodes. This also gives rise to a difficulty in the draining of the undesired charges prior to each exposure, that is, the undesired charges cannot be completely drained so that the remaining charges are mixed with the essential signal charges due to the exposure and the picture quality is deteriorated.

The present invention will now be described in greater detail with reference to the illustrated embodiments.

Figure 2A:
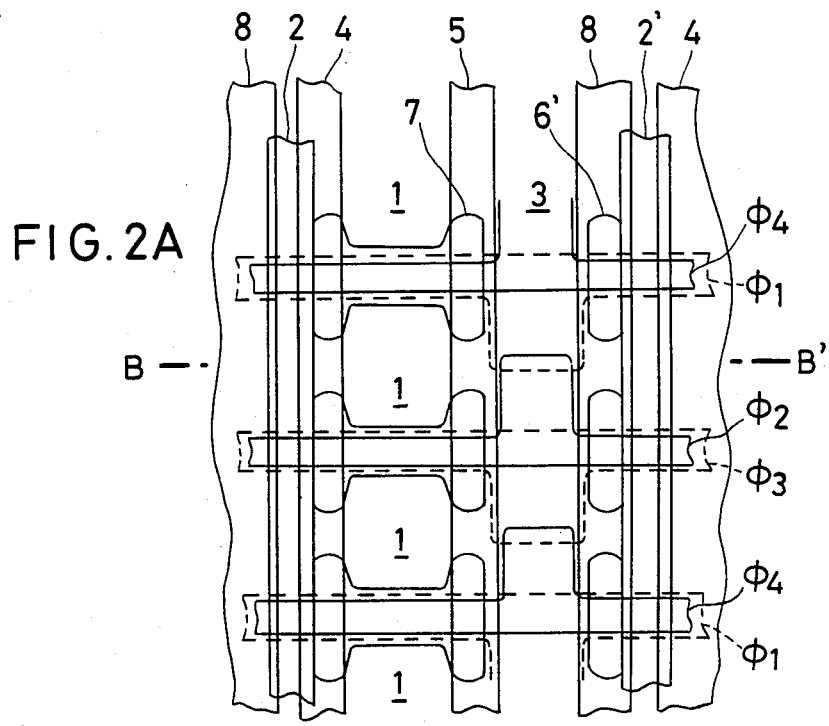
FIGS. 2A and 2B are respectively a plan view and B-B' sectional view showing schematically the principal parts of a first embodiment of a device according to the present invention.
Figure 2B:
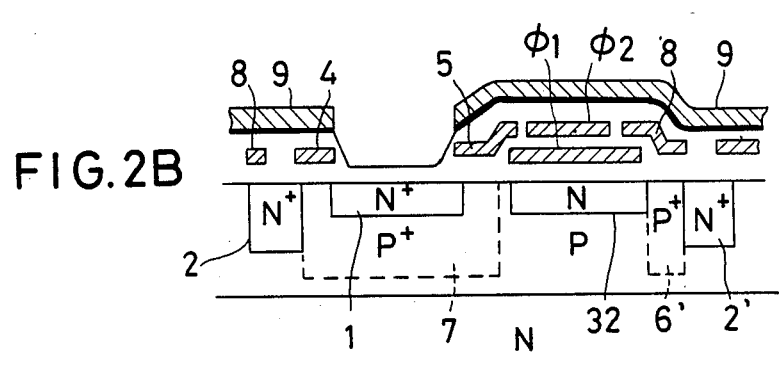

FIG. 2A is a plan view showing the construction of a first embodiment of an interline transfer CCD used with the invention, and FIG. 2B is a sectional view taken along the line B-B' of FIG. 2A.

In these Figures, numeral 1 designates light-receiving photodiodes, 2 an overflow drain, 2' an overflow drain for the adjoining unit element array, 32 a buried channel of a vertical transfer CCD3, 4 an overflow control gate, and 5 a transfer gate. These elements 1 to 5 form a single unit element array. In the case of this embodiment, the vertical transfer CCD of the four-phase drive type and designated at $\Phi_1$ to $\Phi_4$ are the electrodes of the vertical transfer CCD. Numerals 6 and 7 designate channel stops. The channel stops 7 stop the charges produced at the photodiodes 1 from spreading vertically.

The device of this invention differs from the prior art device in that the channel stop 6 heretofore used to prevent the horizontal spreading of charges and which thus took the form of a vertically continuous straight member is now formed with a gap for every picture element as shown in the Figures, and a gate 8 (hereinafter referred to as a clear gate) is arranged above the channel stops 6' so as to control the potential barriers to the electrons at the gaps.

The device of this invention is constructed by forming a P layer on an n-type substrate by injecting boron ions or the like and then injecting phosphor, arsenic or the like by ion injection into the P layer to form n and n+ layers and thereby form the overflow drains 2, the photodiodes 1 and the buried channels 3 of the vertical transfer CCDs as shown in FIG. 2B.

In FIG. 2B, numeral 9 designates a light shielding coating for preventing the portions other than the photodiode 1 from being exposed and particularly preventing the signal charges from being deteriorated while the signal charges are stored in the vertical transfer CCD and read therefrom. Also, the photodiode section of the device has an npn three-layer structure so as to prevent the smear components in the known manner. The voltage applied to the overflow control gate 4 is fixed.

The driving system for the embodiment of the invention will now be described with reference to the device of the invention.

FIG. 3 shows a timing chart of the principal drive pulses required when the device is incorporated in an electronic still picture camera. Designated at $\Phi_1$, $\Phi_2$, $\Phi_3$ and $\Phi_4$ are the four transfer electrode applied voltages of the vertical transfer CCD, and designated at $\Phi_{TG}$ and $\Phi_{CG}$ are the voltage waveforms applied to the transfer gate and the clear gate, respectively.

FIGS. 4A to 4G are schematic diagrams showing the potential barriers to the electrons in the various parts of the device at the times shown in FIG. 3 and the description will now be made in the order of the passage of time.

In the case of this embodiment, the electronic still picture camera incorporating the present device maintains the condition existing at a time $t=t_0$ prior to each exposure for photographing. More particularly, a high voltage is applied to the vertical transfer electrodes $\Phi_1$ $\Phi_2$ and a low voltage is applied to the vertical transfer electrodes $\Phi_3$ and $\Phi_4$. Also, the transfer and clear gate applied voltages $\Phi_{TG}$ and $\Phi_{CG}$ are low and therefore their potential barriers become as shown in FIG. 4A.

Figure 4A:
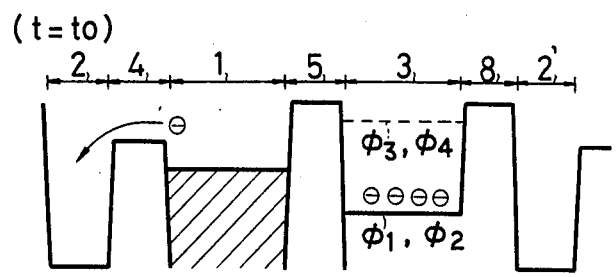
FIGS. 4A to 4G are schematic diagrams showing the potential barrier conditions to the electrons in the various parts at the main times in the operation shown in FIG. 3.

In FIG. 4A, the charges exceeding the saturation point of the photodiodes are drained to the overflow drain 2 since the potential barriers under the overflow contro gate 4 are set lower than the potential barriers under the transfer gate 5.

Figure 4B:
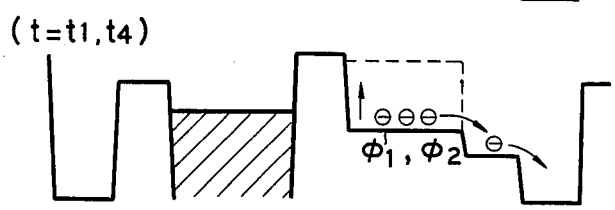

On the other hand, the dark current charges are stored in the vertical transfer CCD as shown in the Figure. To initiate the photographing in this condition, at a time $t=t_1$ a high voltage is first applied to the clear gate 8 to decrease the potential barriers under it and also the applied voltage to the electrodes $\Phi_1$ and $\Phi_2$ is reduced to raise the potential barriers thereunder. As a result, the undesired charges at the buried channel 3 of the vertical transfer CCD are drained to the overflow drain 2' of the adjoining unit element array as shown in FIG. 4B. FIG. 4B shows that the potentials $\Phi_1$ and $\Phi_2$ to the electrons under the electrodes $\Phi_1$ and $\Phi_2$ are in the course of being increased gradually and eventually they rise to the level of the broken line. By virtue of this operation, the undesired charges at the buried channel 3 of the vertical transfer CCD are transferred as a whole to the overflow drain 2' without performing any transfer operation.

Figure 4C:
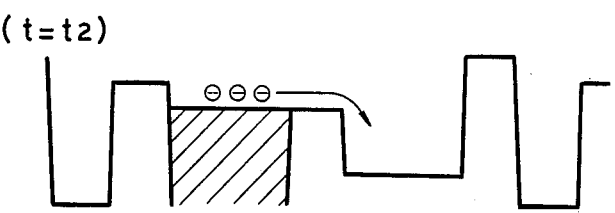

Then, the voltage to the transfer electrodes $\Phi_1$ and $\Phi_2$ is again raised to the high voltage and a voltage is applied to the transfer gate 5 at a time $t=t_2$. As a result, the charges exceeding the potential barriers determined by the transfer gate applied voltage $\Phi_{TG}$ are transferred from the photodiodes 1 to the potential wells under the electrodes $\Phi_1$ and $\Phi_2$ as shown in FIG. 4C. In this case, no difficulty will be caused from the practical point of view even if the voltage application time for the transfer gate 5 is increased sufficiently to on the order of 1 m sec, for example. Thus, this transfer can practically be considered as a complete transfer.

At a time $t=t_3$, the applied voltage to the transfer gate 5 is again restored to the low voltage so that the charges of the photodiodes 1 exceeding the predetermined reference potential barrier are transferred to the vertical transfer CCD 3 and then at a time $t=t_4$ the high voltage is again applied to the clear gate 8 thereby draining these charges to the overflow drain 2' of the adjoining unit element array as shown in FIG. 4B.

By virtue of the above-described operation, the undesired charges of both the vertical transfer CCD 3 and the photodiodes 1 can be drained through the clear gate 8 or the clear gate 8 and the transfer gate 5 prior to each photographing.

Figure 4D:
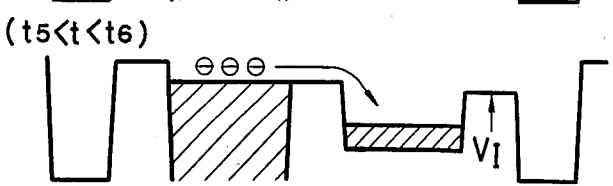
Figure 4E:
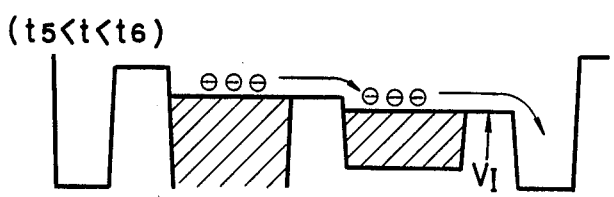

On the other hand, the storage of signal charges is started at the time $t=t_3$ at which the applied voltage to the transfer gate 5 is restored to the low voltage. The time interval between the time t at which the charges transferred from the photodiodes 1 to the vertical transfer CCD 3 are drained and a time t is as small as several microseconds sec. Thus, the exposure is continued even after the time $t_5$. After the time $t_5$, the high voltage is again applied to the transfer gate 5 so that the potential barrier condition shown schematically in FIGS. 4D or 4E is maintained until the proper exposure time is completed. In other words, the signal charges produced at the photodiodes 1 move over the potential barriers under the transfer gate 5 and transfer to the vertical transfer CCD 3. At this time, the voltage indicated at $V_1$ in FIG. 3 is applied to the clear gate 8 and thus the potential barriers under the clear gate 8 are set lower than the potential barriers under the transfer gate 5.

In this case, it is needless to say that no voltage is applied to the electrodes $\Phi_3$ and $\Phi_4$ of the vertical transfer CCD 3 so that the potential barriers under the clear gate 8 are lower than the potentials $\Phi_3$ and $\Phi_4$ to the electrons under the electrodes $\Phi_3$ and $\Phi_4$ and the overflow signal charges are prevented from spreading vertically.

As a result, the overflow charges from the vertical transfer CCD 3 are drained to the overflow drain 2' of the adjoining unit element array as shown in FIG. 4e.

The correct exposure time which starts at the time, $t_3$ and ends at the time $t_6$, may be conveniently computed by means of separately provided light metering means and a light metering circuit.

Figure 4F:
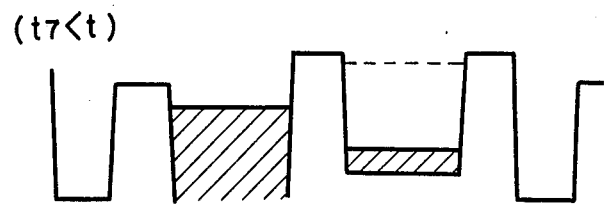
Figure 4G:
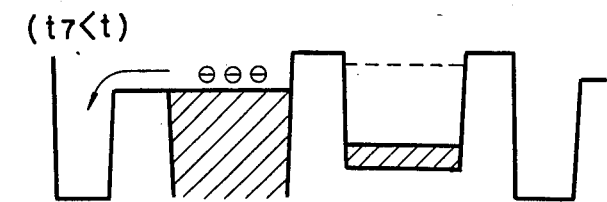

After the exposure has been completed and the transfer gate voltage and the clear gate voltage have been reduced to the low voltage and after a time $t_7$, the signal charges stored in the vertical transfer CCD 3 are transferred and read in the same manner as in the ordinary interline transfer CCD. The potential conditions at these times are shown in FIGS. 4F and 4G. Just after the completion of the photographing, the most of the photodiodes 1 are not in the saturated state and there exists the condition shown in FIG. 4F. However, at the expiration of a certain time, the charges start to saturate at some of the photodiodes 1 and consequently the overflow charges are drained to the overflow drain in the same unit element array as shown in FIG. 4G. As a result, the occurrence of blooming phenomena is suppressed during the reading of the signal charges. FIGS. 4A to 4G show only the case where the charges are taken from the photodiodes 1 which are adjacent to the electrodes $\Phi_1$ and $\Phi_2$ of the vertical transfer section 3. To take the charges from the photodiodes 1 which are adjacent to the electrodes $\Phi_3$ and $\Phi_4$, it is only necessary to reverse the timings of the voltages applied to the electrodes $\Phi_1$, $\Phi_2$ and the electrodes $\Phi_3$, $\Phi_4$, respectively.

Figure 5:
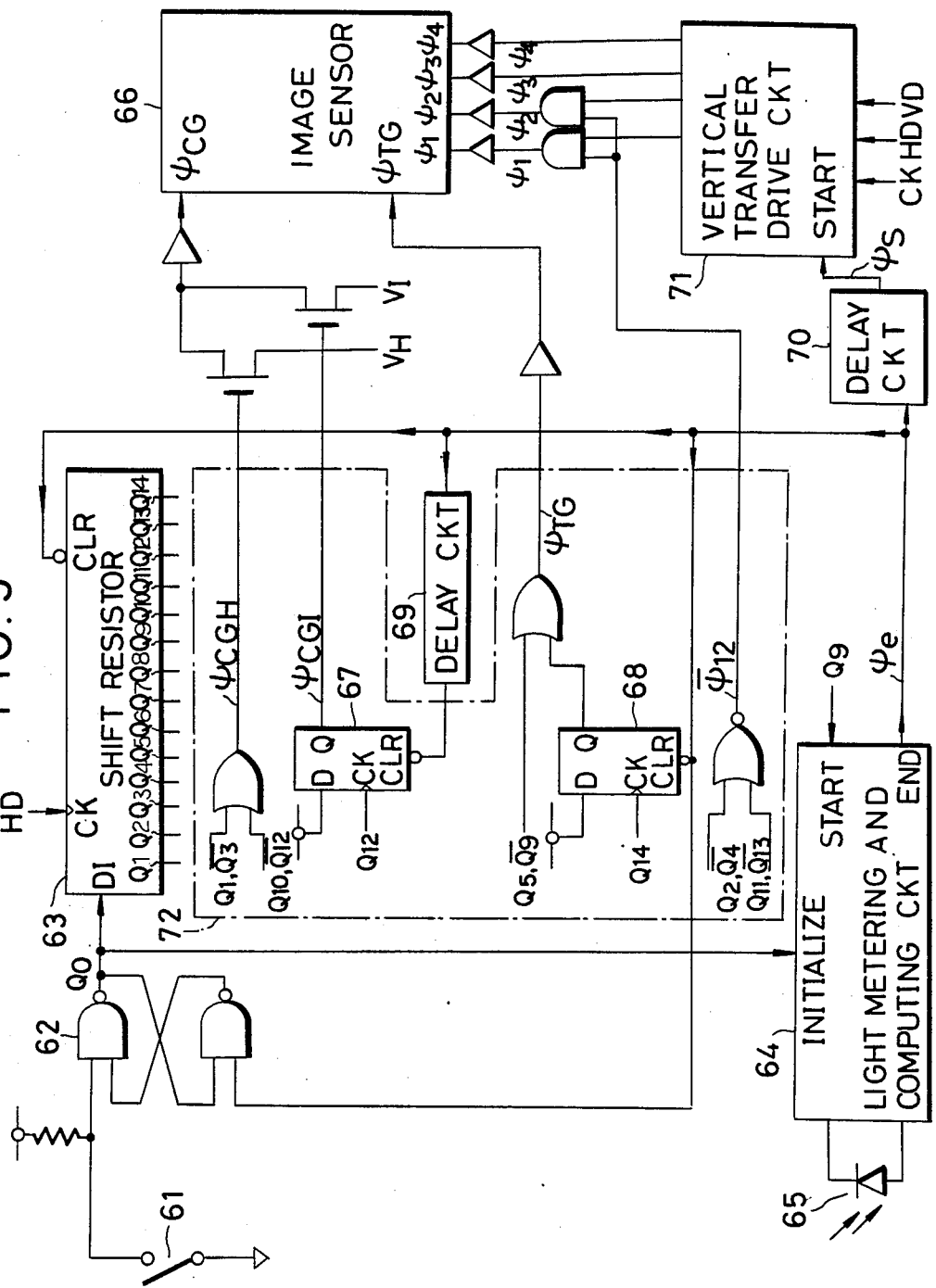
FIG. 5 is a block diagram showing the principal parts of an electronic still picture camera incorporating the first embodiment of the invention.
Figure 6:
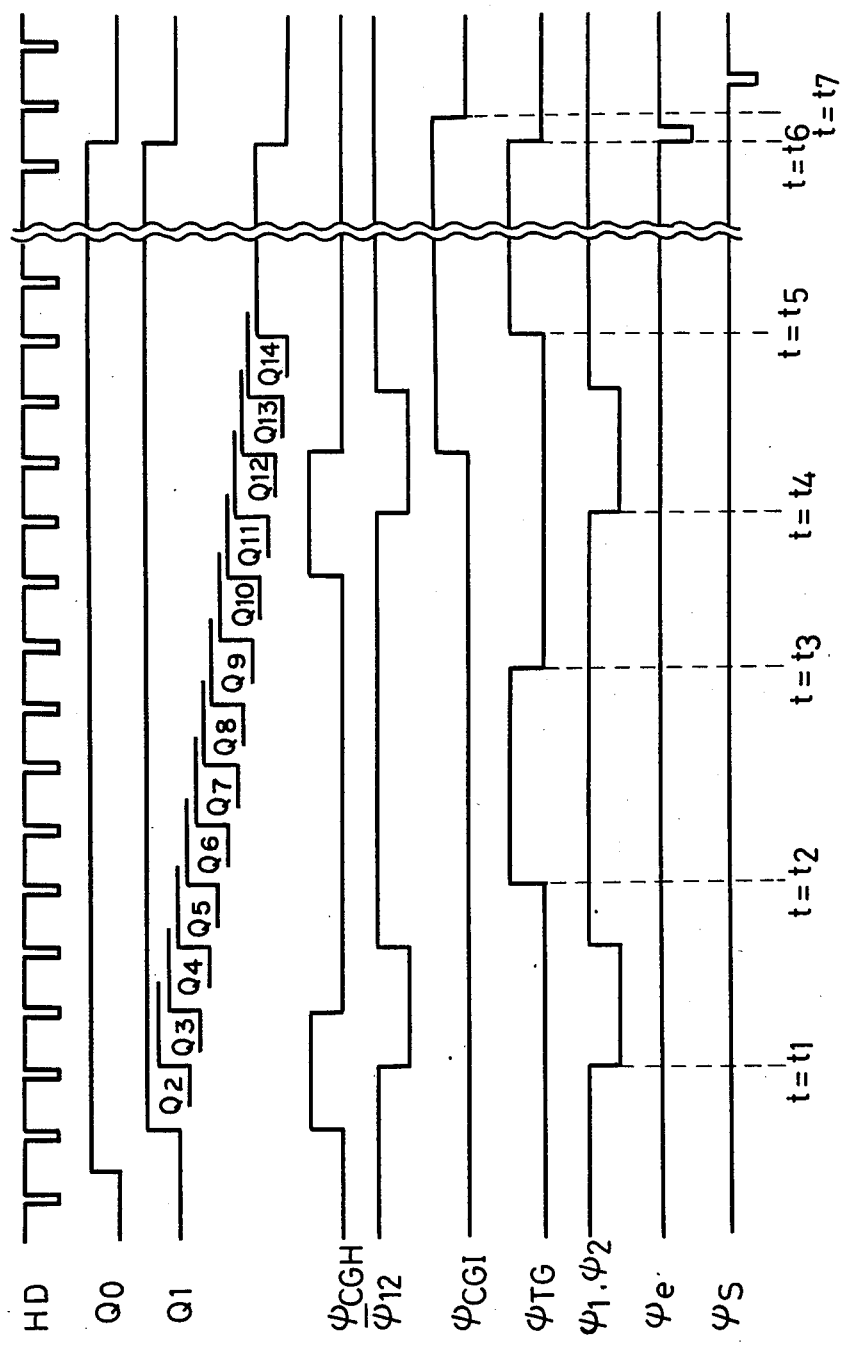
FIG. 6 is a timing chart showing the timing of the pulses generated at various points in FIG. 5.

FIG. 5 is a partial block diagram of an electronic still picture camera useful for explaining the operation of the first embodiment of the invention, and FIG. 6 is a timing chart showing the timing of the pulses at various points in FIG. 5. For purposes of simplifying the description of the pulse required for the CCD image sensor, only the method of generation of the clear gate pulse $\Phi_{CG}$, transfer gate pulse $\Phi_{TG}$ and four-phase vertical transfer clocks $\Phi_1$ to $\Phi_4$ is shown. In FIG. 5, when a release switch 61 is turned on, the output Q$\delta$ of a flip-flop 62 comprising two NAND gates goes to a high level. The output Q$\delta$ is applied to a 14-bit shift register 63 and a light metering and computing circuit 64 and it serves as a shift-in input for the shift register 63 and as an initialize pulse for the light metering and computing circuit 64.

In the present embodiment, the exposure timing is synchronized with a television synchronizing signal generating circuit (not shown) and also horizontal drive signals HD are applied as clocking signals to the shift register 63. Consequently, pulses are generated at the 14-bit outputs $Q_1$ to $Q_{14}$ of the shift register 63 in response to the input $Q_{96}$ as shown in the timing chart of FIG. 6.

In response to these outputs, a logical circuit 72 shown by the dot-and-dash line in the center of FIG. 5 generates a pulse $\Phi_{CGH}$ for applying the high voltage $V_H$ to the clear gate, a pulse $\Phi_{CGI}$ for applying the intermediate voltage $V_I$ to the clear gate, a transfer gate pulse $\Phi_{TG}$ and a pulse $\Phi_{12}$ for forcibly changing the vertical transfer clocking signals $\Phi_1$ and $\Phi_2$ to the low level as shown in the timing chart of FIG. 6. Also the output $Q_O$ is applied directly to the light metering and computing circuit 64, which in turn initiates the computation of an exposure time in accordance with the output of light measuring means 65. When the proper light quantity for an image sensor 66 is reached, the light metering and computing circuit 64 generates an end-of-exposure pulse as shown at $\Phi_e$ in FIG. 6. The pulse $\Phi_e$ clears the flip-flop, 62, the shift register 63 and two D-type flip-flops 67 and 68. However, the D-type flip-flop 67 is cleared through a delay circuit 69 and thus the falling edge of the pulse $\Phi_{CGI}$ is delayed by a time $\tau_1$ with respect to the other pulses. This delay time $\tau_1$ corresponds to the time interval between the times $t=t_6$ and $t=t_7$ in the timing chart of FIG. 6. The pulse $\phi_e$ is passed through another delay circuit 70 so that it serves as a start pulse $\Phi_s$ for a vertical transfer drive circuit 71 and the vertical transfer of the signal charges in the device is started.

The times $t_1$ to $t_7$ indicated in the lowermost part of FIG. 6 completely correspond to the times $t_1$ to $t_7$ shown in FIG. 3.

Figure 7:
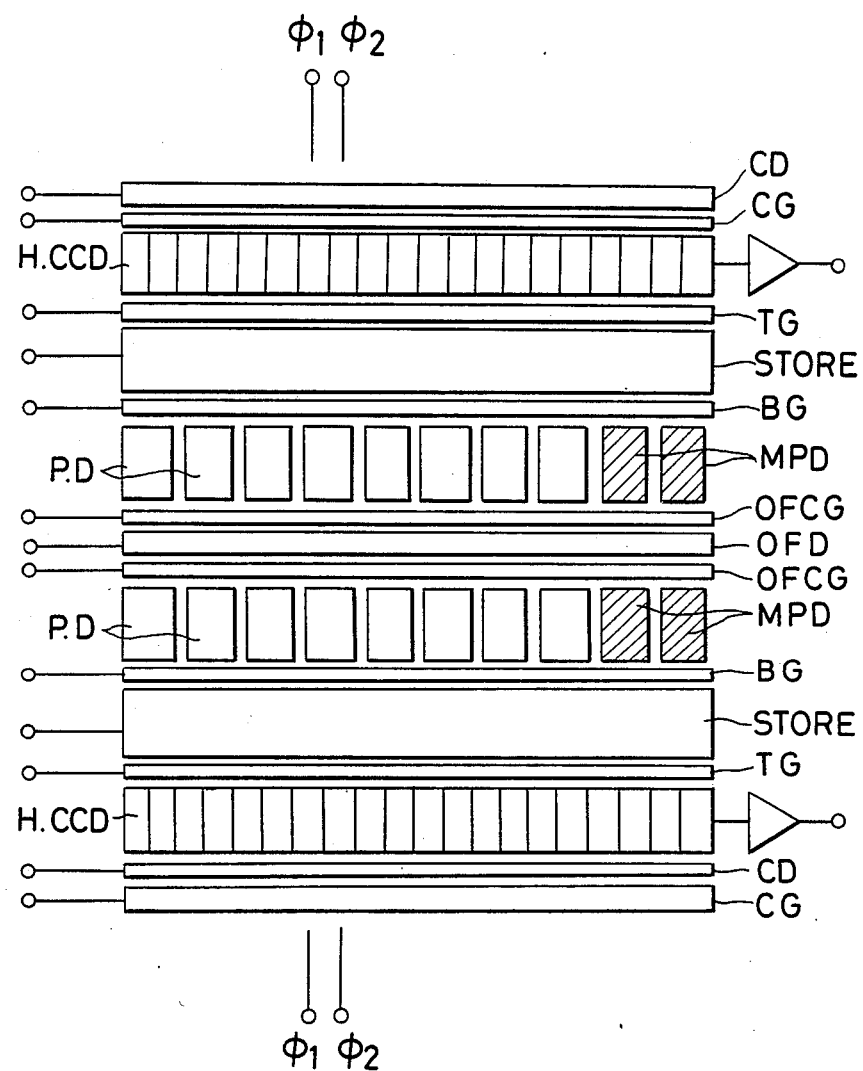
FIG. 7 is a schematic diagram of an automatic focusing sensor to which the invention is applied.

FIG. 7 shows another embodiment in which the present invention is applied to an automatic focussing sensor and the principle of the automatic focussing is applicable to either the front and rear focus image error detection system or the dual system coincidence system.

In the Figure, two rows of photodiodes PD are arranged parallel to each other and a common overflow drain OFD is arranged between the rows. Disposed on the sides of the overflow drain OFD are overflow control gates OFCG for controlling the level of potentials during the draining of charges to the overflow drain. It is needless to say that each of the photodiodes is isolated in the horizontal direction by a channel stop (not shown). The charges produced at each row of the photodiodes are stored in the potential wells under a store gate STORE through a barrier gate BG. After the completion of the exposure for a predetermined time, the barrier gate BG is closed and the charges under the store gate STORE are read into a horizontal transfer CCD (H.CCD) via a transfer gate TG. In this embodiment, the horizontal transfer CCD (H.CCD) is driven by two-phase clocking signals of different phase $\Phi_1$ and $\Phi_2$. A clear gate CG and a clear drain CD are arranged on the side of the horizontal transfer CCD (H.CCD) opposite to the transfer gate TG so as to drain the charges in the horizontal transfer CCD (H.CCD) as a whole. As a result, the undesired charges within the device (the dark current charges or the undesired charges due to the driving timing of the device) can be drained by means of several clocking signals T most. Note that MPD indicated by the hatching are photosensitive elements which serve as optical black lamps for detecting the dark currents in the photodiodes PD.

Note that in the Figure only the photodiodes can be exposed to light and the other parts of the device are shielded from light.

Figure 8A:
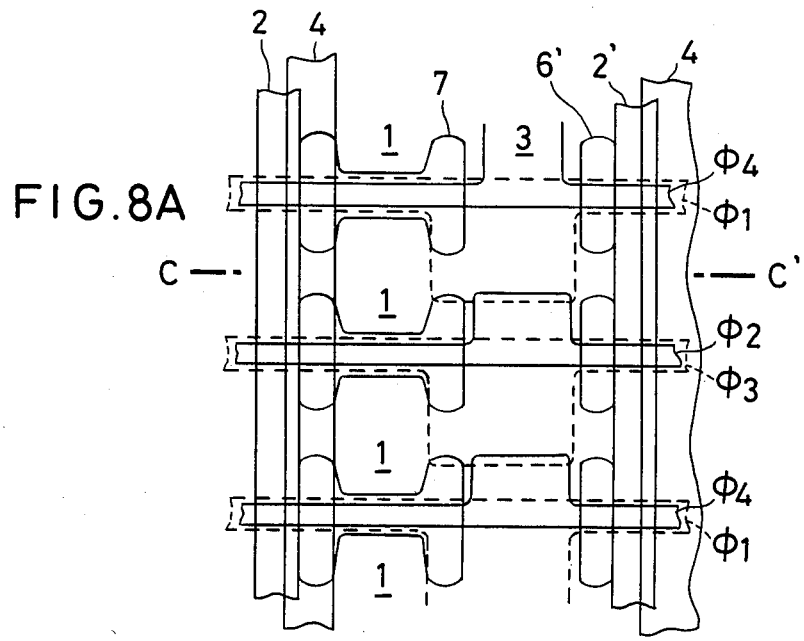
FIGS. 8A, 8B and 8C are respectively a plan view, C-C' sectional view and potential diagram showing schematically the principal parts of a second embodiment of the invention.
Figure 8B:
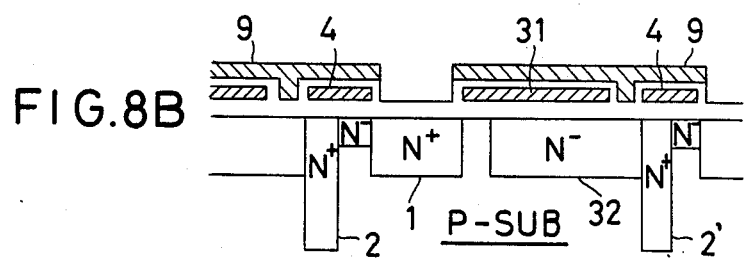

FIGS. 8a and 8b are respectively a plan view and C—C' sectional view showing schematically a part of an interline transfer CCD according to a second embodiment of the invention. This CCD includes no transfer and clear gates, and vertical transfer electrodes $\Phi_1$, $\Phi_2$, $\Phi_3$ and $\Phi_4$ are separated from the adjacent overflow drain 2. Note that in FIG. 8b the vertical transfer electrodes $\Phi_1$, $\Phi_2$, $\Phi_3$ and $\Phi_4$ are designated at 31 for purposes of description.

In FIG. 8b, the right side of a buried channel 32 of a transfer section 3 adjoins an overflow drain 2' of the adjoining unit element array so as to permit draining of the charges from a channel 32 to the overflow drain 2' and the undesired charges from the light-receiver photodiodes 1 of the associated unit element array can also be drained to the overflow drain 2' as will be seen from the overflow drain on the left side in FIG. 8B.

As shown in FIG. 8B, the vertical transfer electrodes 31 are adapted to form the potential wells only in the vicinity of the photodiode array 1 on the left side of the buried channel 32 with the result that the left sides of the electrodes 31 extend over the photodiode array 1 and their right sides are separated from the adjoining overflow drain 2'.

As a result, in the device of FIGS. 8A and 8B each unit element array includes only the vertical transfer electrodes 31 and the electrode of an overflow control gate 4 as its electrodes and the electrodes may be simpler in electrode construction than previously. Also, the voltage applied to the electrode of the overflow control gate 4 is fixed and therefore the potential of the overflow control gate 4 is also fixed.

A driving method by which an image sensor incorporating the interline transfer CCD according to the above-described second embodiment is caused to perform a shutter operation electronically, will now be described with reference to the potential diagram of FIG. 8C as follows.

Figure 8C:
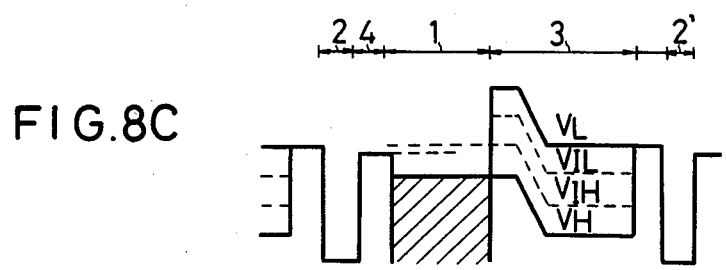

When the potentials of the vertical transfer electrodes $\Phi_1$ and $\Phi_2$ or $\Phi_3$ and $\Phi_4$ of this CCD are reduced to the lowest voltage $V_L$, the potential of the buried channel 32 attains the highest potential as shown in FIG. 8C so that if there are any charges at the channel 32, all the charges are drained to the adjoining overflow drain 2'. On the other hand, when the potentials of the vertical transfer electrodes $\Phi_1$ and $\Phi_2$ and $\Phi_3$ and $\Phi_4$ attain the highest potential $V_H$, the potential barriers between them and the photodiodes 1 decrease and thus the signal charges are transferred from the photodiodes 1 to the potential wells formed on the left side of the buried channel 32 in the Figure.

To vertically transfer the signal charges, it is only necessary to effect the transfer by applying as transfer potentials two different voltage levels $V_{IL}$ and $V_{IH}$ which are intermediary between the voltages $V_L$ and $V_H$. In this case, it is of course necessary to adjust the voltages $V_{IL}$ and $V_{IH}$ and the overflow control gate voltage in such a manner that the potential barriers between the photodiode array 1 and the buried channel 32 become higher than the potential barriers between the photodiode array 1 and the adjoining overflow drain 2' when either of the voltages $V_{IL}$ and $V_{IH}$ is applied to the electrodes $\Phi_1$, $\Phi_2$, $\Phi_3$ and $\Phi_4$.

By so doing, it is possible to simultaneously and collectively drain to the adjoining overflow drain 2' the undesired charges from the photodiode array 1 by the overflow control gate 4 and to drain the undesired charges from the channel 32 of the vertical transfer section 3 in response to the application of the voltage $V_L$ to the vertical transfer electrodes $\Phi_1$ and $\Phi_2$ or $\Phi_3$ and $\Phi_4$ 4 without using the transfer gate and the clear gate is in the case of the first embodiment of this invention.

Figure 9A:
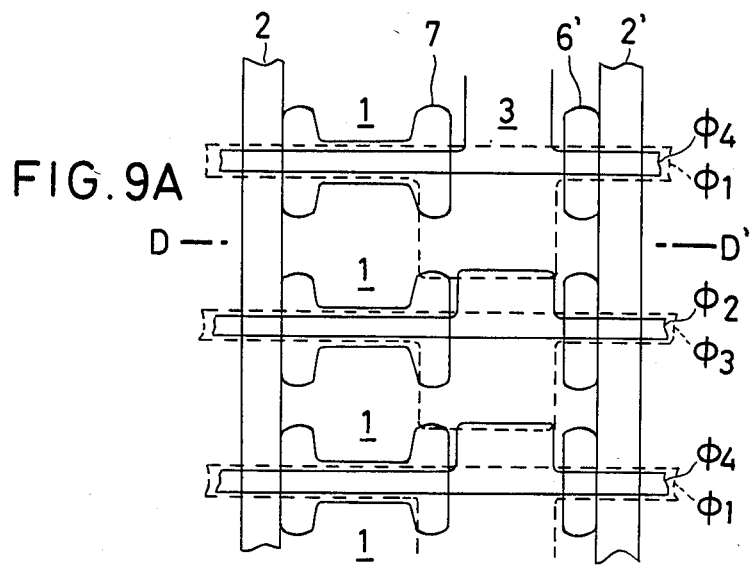
FIGS. 9A, 9B and 9C are respectively a plan view, D-D' sectional view and potential diagram showing schematically the principal parts of a third embodiment of the invention.
Figure 9B:
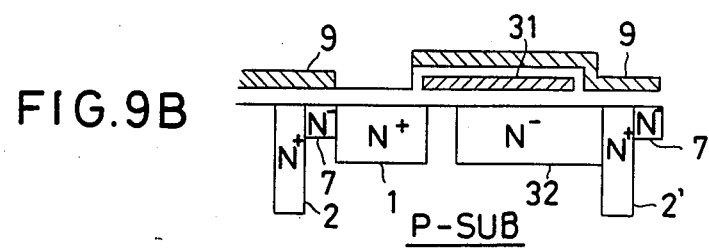
Figure 9C:
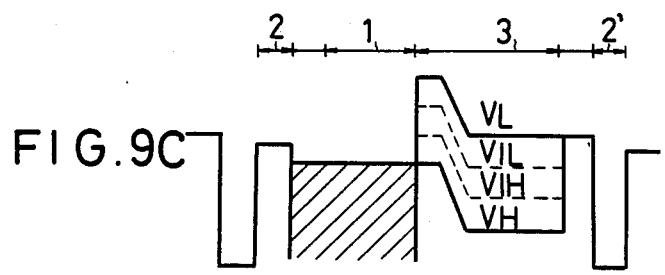

FIGS. 9A, 9B and 9C are respectively a plan view D—D', sectional view and potential diagram showing schematically a third embodiment of the invention and this third embodiment differs from the second embodiment of FIGS. 8A and 8B in that the construction is simplified by eliminating even the overflow drain control gate electrode 4 and only the vertical transfer electrodes 31 are provided as the necessary electrodes. In this embodiment, the potential barriers between the photodiode array 1 and the overflow drain 2 are fixed by the regions designated by numeral 7 shown in FIG. 9B and formed in the n-type region having a lower donor density than the former two. Note that the vertical transfer electrodes $\Phi_1$, $\Phi_2$, $\Phi_3$ and $\Phi_4$ are designated by 31 in FIG. 9B for purposes of description.

Now describing the operation of the CCD of this embodiment with reference to FIG. 9C, in the same manner as in the second embodiment of FIGS. 8A and 8B, the four voltages $V_L$, $V_{IL}$, $V_H$ and $V_{IH}$ are applied to the vertical transfer electrodes 31 and the resulting operations are the same in the case of the second embodiment. However, the device of the third embodiment differs essentially from the second embodiment in that the overflow control gates 4 are eliminated. However, as in the case of the second embodiment, the draining of the undesired charges from the photodiode array 1 to the overflow drain 2' is not completely impossible and this can still be made in a much shorter period of time than in the prior art device along with the draining of the undesired charges from the vertical transfer channel.

In other words, this is accomplished by first applying the high voltage $V_H$ to the vertical transfer electrodes $\Phi_1$ and $\Phi_2$ and $\Phi_3$ and $\Phi_4$, thereby transferring the undesired charges from the photodiode array 1 to the buried channel 32 under the electrodes and then applying the low voltage $V_L$ to the vertical transfer electrodes $\Phi_1$ and $\Phi_2$ and $\Phi_3$ and $\Phi_4$ thereby draining the undesired charges transferred to the channel 32 to the adjoining overflow drain 2'.

By so doing, the draining of the undesired charges from the vertical transfer section 3 is effected by the first-stage transfer and the draining of the undesired charges from the photodiode array 1 is effected by the second-stage transfer. Thus, if the device is used as a shutter function equipped area imaging device for electronic still picture cameras, prior to the start of each exposure all the undesired charges can be completely drained in as small pulses in order as one or two clock time to prepare for the photographing.

The same effects can also be obtained by another embodiment (not shown) which is designed so that instead of forming gaps in a conventional channel stopper 6 (see FIG. 1A) provided between the vertical transfer section 3 and the overflow drain 2', a horizontal CCD structure is formed by the ordinary method and thus the charges from the vertical transfer section 3 are collectively drained to the overflow drain 2'.

Figure 10A:
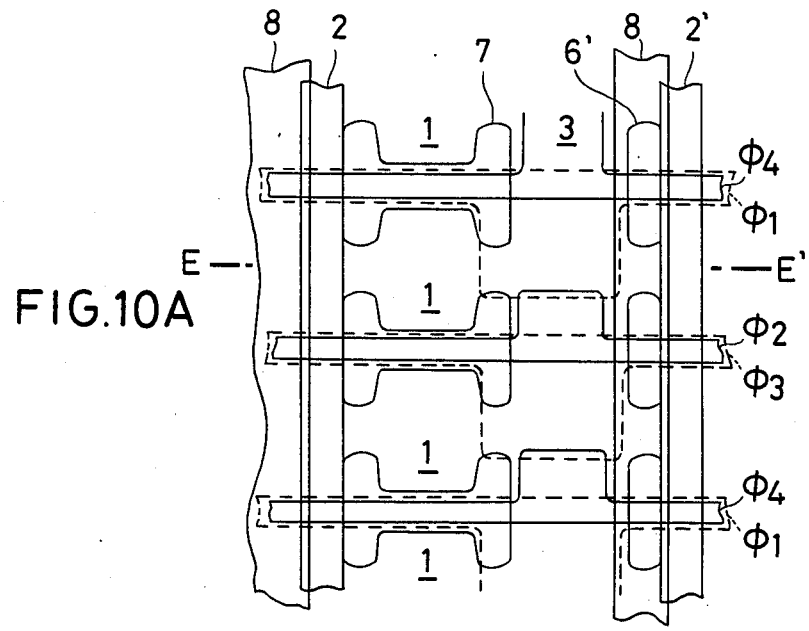
FIGS. 10A, 10B and 10C are respectively a plan view, E-E' sectional view and potential diagram showing schematically the principal parts of a fourth embodiment of the invention.
Figure 10B:
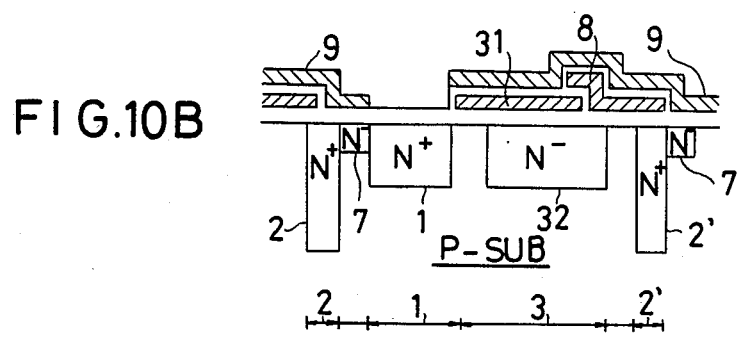
Figure 10C:
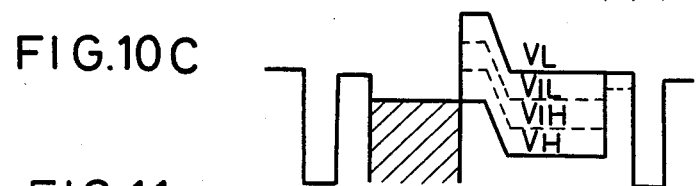

FIGS. 10A, 10B and 10C show a fourth embodiment of the invention which differs from the construction of the third embodiment in that a clear gate 8 is provided between the vertical transfer section 3 and the overflow drain 2'. By thus providing the clear gate 8, even if the vertical transfer channel 32 is substantially separated from the overflow drain 2' of the adjoining unit element array, the potentials just under the clear gate 8 can be adjusted by controlling the voltage applied to the clear gate 8 and in this way the same functions and effects as in the third embodiment can be obtained, although the electrode structure is somewhat complicated.

Figure 11:
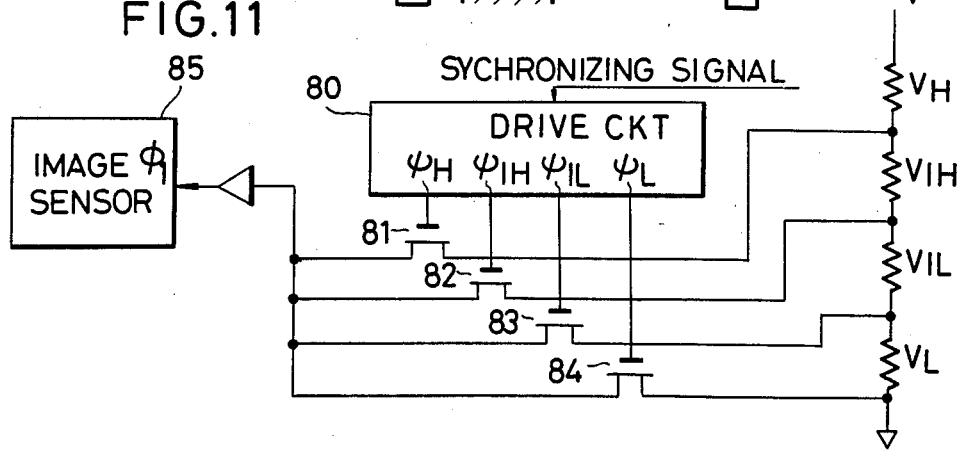
FIG. 11 is a block diagram for controlling the voltages applied to the electrode $\Phi_1$ in the second, third and fourth embodiments of the invention.

FIG. 11 shows a block diagram for controlling the voltages applied to the electrode $\Phi_1$ in the second, third and fourth embodiment of the invention.

The voltages $V_H$, $V_{IH}$, $V_L$ and $V_{IL}$ applied to the electrode $\Phi_1$ are produced by dividing a voltage through resistors. In accordance with the pulses $\Phi_H$, $\Phi_{IH}$, $\Phi_{IL}$ and $\Phi_L$ a drive circuit 80 controls the opening and closing of analog switches 81, 82, 83 and 84 and thereby controls the voltages $V_H$, $V_{IH}$, $V_{IL}$ and $V_L$ applied to the electrode $\Phi_1$ of an image sensor 85. In the second, third and fourth embodiments, the voltages $V_H$, $V_{IH}$, $V_{IL}$ and $V_L$ are applied only to the electrodes $\Phi_1$ and $\Phi_3$ of the vertical transfer section 3 which are adjacent to the photodiodes 1. Only the voltages $V_{IH}$ and $V_{IL}$ for vertical transfer purposes are while the applied to the electrodes $\Phi_2$ and and $\Phi_4$. As a result block for controlling the voltages applied to the electrode $\Phi_3$ is the same, the timing of pulses generated to analog switches corresponding to the analog switches 81 to 84 from a circuit corresponding to the drive circuit 80 for controlling the timing of application of the voltages $V_H$, $V_{IH}$, $V_{IL}$ and $V_L$ to the electrode $\Phi_3$ is different from the timing of the pulses generated from the drive circuit 80.

What is claimed is:

1. A solid-state area imaging device having first and second stripe-shaped light intensity detecting means arranged adjacent to a predetermined plane, each of said light intensity detecting means comprising:
   (a) a plurality of photosensitive elements each having a photosensitive surface arranged near said predetermined plane so as to produce an amount of electric charge corresponding to an intensity of light received by said photosensitive surface, said plurality of photosensitive elements being arranged in a row;
   (b) drain means for draining a portion of said charges produced by said plurality of photosensitive elements, said drain means being arranged along said row of said plurality of photosensitive elements;
   (c) first gate means for forming a first potential barrier, said first gate means being arranged between said drain means and said row of said plurality of photosensitive elements;
   (d) transfer means for storing charges and then transferring said charges to outside of said device, said transfer means forming a second potential barrier and a potential well whereby the potential of said second potential barrier is higher than the potential of said potential well and being arranged along said row of photosensitive elements on the side opposite to said first gate means;
   (e) second gate means for forming a third potential barrier, said second gate means being arranged along said transfer means on the side opposite to said row of photosensitive elements; and
   (f) control means for controlling the potential of said second potential barrier and said potential well with the potential difference between said second potential barrier and said potential well being substantially constant, said control means having first, second and third control states, said potential well being arranged between said second potential barrier and said third potential barrier, wherein said control means controls the potential of said second potential barrier whereby the potential of said second potential barrier is lower than the potential of said first potential barrier and said third potential barrier and said transfer means stores charges produced by said plurlaity of photosensitive elements in said potential well when said control means is in said first control state, said control means controls the potential of said second potential barrier and said potential well whereby the potential of said second potential barrier is higher than the potential of said first potential barrier and the potential of said potential well is lower than the potential of said third potential barrier and said transfer means transfers charges to outside of said device when said control means is in said second control state, and said control means controls the potential of said potential well whereby the potential of said potential well is not less then the potential of said third potential barrier and said transfer means of one light intensity detecting means transfers charges therein to said drains means of the other light intensity detecting means when said control means is in said third control state.

2. The solid-state area imaging device according to claim 1, wherein the potential of said first potential barrier and the potential of said third potential barrier are constant respectively.

* * * * *